/

US009144163B2

(12) United States Patent  (10) Patent No.: US 9,144,163 B2
Lu et al. (45) Date of Patent: Sep. 22, 2015

(54) EXTERNAL STORAGE DEVICE ENCLOSURE

(71) Applicant: WISTRON CORP., New Taipei (TW)

(72) Inventors: Nan You Lu, New Taipei (TW); Yi-Jiun Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 274 days.

(21) Appl. No.: 13/892,012

(22) Filed: May 10, 2013

(65) Prior Publication Data

US 2014/0077676 A1    Mar. 20, 2014

(30) Foreign Application Priority Data

Sep. 17, 2012    (TW) .............................. 101133969 A

(51) Int. Cl.
| | |
|---|---|
| *G06F 1/16* | (2006.01) |
| *H05K 5/02* | (2006.01) |
| *G06F 1/18* | (2006.01) |
| *G11B 33/02* | (2006.01) |
| *G11B 33/12* | (2006.01) |
| *H05K 5/00* | (2006.01) |
| *H05K 7/00* | (2006.01) |

(52) U.S. Cl.
CPC .............. *H05K 5/0247* (2013.01); *G06F 1/181* (2013.01); *G06F 1/183* (2013.01); *G06F 1/184* (2013.01); *G06F 1/185* (2013.01); *G06F 1/186* (2013.01); *G06F 1/187* (2013.01); *G11B 33/027* (2013.01); *G11B 33/121* (2013.01); *H05K 5/0239* (2013.01)

(58) Field of Classification Search
CPC ......... G06F 1/187; G06F 1/183; G06F 1/184; G06F 1/185; G06F 1/186; G06F 1/181

USPC ............ 361/679.01, 679.02, 679.31, 679.32, 361/679.33, 679.34, 679.35, 679.37, 361/679.38, 679.39, 679.4, 679.41, 679.43, 361/679.44, 679.45, 679.57, 679.58, 728, 361/730, 731, 732, 752, 754, 755, 756, 759
See application file for complete search history.

(56) References Cited

U.S. PATENT DOCUMENTS 5,980,294 A * 11/1999 Kanda et al. .................. 439/326
6,515,855 B1    2/2003 Yen Kuang \* cited by examiner

*Primary Examiner* — Hoa C Nguyen
*Assistant Examiner* — Binh Tran
(74) *Attorney, Agent, or Firm* — Li & Cai Intellectual Property (USA) Office

(57) ABSTRACT

An external storage device enclosure includes a box-body portion and a cover-body portion. The box-body portion supports a storage device, and has a connection port. The cover-body portion includes a cover-board and a top-board. A first-side of the top-board connects the cover-board. The top-board is pivotally connected to the box-body portion through a rotation axis located a second-side of the top-board. When the cover-body portion rotates around the rotation axis and covers the storage device, a driving element of the cover-board contacts a first-side of the storage device to electrically connect a connection slot of the storage device and the connection port. When the cover-body portion rotates around the rotation axis and exposes the storage device, a releasing element located at the first-side of the top-board contacts a second-side of the storage device to electrically separate the connection slot of the storage device from the connection port.

13 Claims, 9 Drawing Sheets

EXTERNAL STORAGE DEVICE ENCLOSURE

BACKGROUND

1. Technical Field

The present disclosure relates to an external storage device enclosure; in particular, to an external storage device enclosure capable of automatically plugging a storage device to a connection port or unplugging the storage device from the connection port.

2. Description of Related Art

Compared to the flash memory (such as a flash disk or memory card) or the CD-ROM, the hard disk has a large amount of data storage capacity, high durability, and high stability, and is a main device which a computing device stores data.

Traditionally, the hard disk is screwed at the inner wall of the casing of the computing device. Therefore, when the data of the computing device is to be moved to another computing device, the hard disk must be detached from the casing of the computing device, and then installed inside the casing of another computing device, such that it is inconvenient to operate due to the detachment and installation of the hard disk In order to improve the problems, an external hard disk enclosure is developed, and the user can install and detach the hard disk without opening the casing. However, when the user want to detach the hard disk from the external hard disk enclosure, the user still need to unplug the hard disk from the connection port of computing device manually. Or alternatively, when the user want to install the hard disk inside the external hard disk enclosure, the user still need to connect the hard disk to the connection port of the computing device. Although the external hard disk enclosure can simplify the procedure for opening the casing, it is still inconvenient to operate due to the requirement for electrically connecting or separating the connection slot of the hard disk and the connection port of the computing device by hand.

SUMMARY

An exemplary embodiment of the present disclosure provides an external storage device enclosure. With the design that both of the driving element and the releasing element are located on the cover-body portion, the external storage device electrically connects or separates the connection slot set of storage device and the connection port of the external storage device enclosure when the cover-body portion closes or opens.

An exemplary embodiment of the present disclosure provides an external storage device enclosure for accommodating a storage device. The external storage device enclosure comprises a box-body portion and a cover-body portion. The box-body portion supports a storage device, and has a connection port. The cover-body portion includes a cover-board and a top-board. The cover-board has a driving element. The top-board has a first-side, a second-side, and a rotation axis located at the second-side of the top-board, wherein the first-side of the top-board connects the cover-board, and the top-board is pivotally connected to the box-body portion through the rotation axis. When the cover-body portion rotates around the rotation axis and covers the storage device, the driving element contacts a first-side of the storage device to electrically connect a connection slot of the storage device and the connection port.

An exemplary embodiment of the present disclosure provides an external storage device enclosure. With the design that the driving element is located on the box-body portion and the releasing element is located on the cover-body portion, the external storage device electrically connects or separates the connection slot set of storage device and the connection port of the external storage device enclosure when the cover-body portion closes or opens.

An exemplary embodiment of the present disclosure provides an external storage device enclosure for accommodating a storage device. The external storage device enclosure comprises a box-body portion and a cover-body portion. The box-body portion supports the storage device, and has a connection port and a driving element. The cover-body portion comprises a cover-board and a top-board. The top-board has a first-side, a second-side, and a rotation axis located at the second-side of the top-board, wherein the first-side of the top-board connects the cover-board, and the top-board is pivotally connected to the box-body portion through the rotation axis. When the cover-body portion rotates around the rotation axis and covers the storage device, the top-board contacts an outer-side of the driving element, and thus an inner-side of the driving element contacts a first-side of the storage device to electrically connect the connection slot of the storage device and the connection port.

In summary, an exemplary embodiment of the present disclosure provides an external storage device enclosure. With the design of the driving element and the releasing element, the external storage device electrically connects or separates the connection slot set of storage device and the connection port of the external storage device enclosure when the cover-body portion closes or opens. Accordingly, when the storage device is to be installed inside the external storage device enclosure, a problem that the connection slot of the storage device must be firstly electrically connected to the connection port is solved; and when the storage device is to be detached from the external storage device enclosure, a problem that the connection slot of the storage device must be firstly electrically separated from the connection port is also solved.

In order to further the understanding regarding the present disclosure, the following exemplary embodiments are provided along with illustrations to facilitate the disclosure of the present disclosure.

DETAILED DESCRIPTION OF T EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Exemplary Embodiment of External Storage Device Enclosure

Figure 1A:
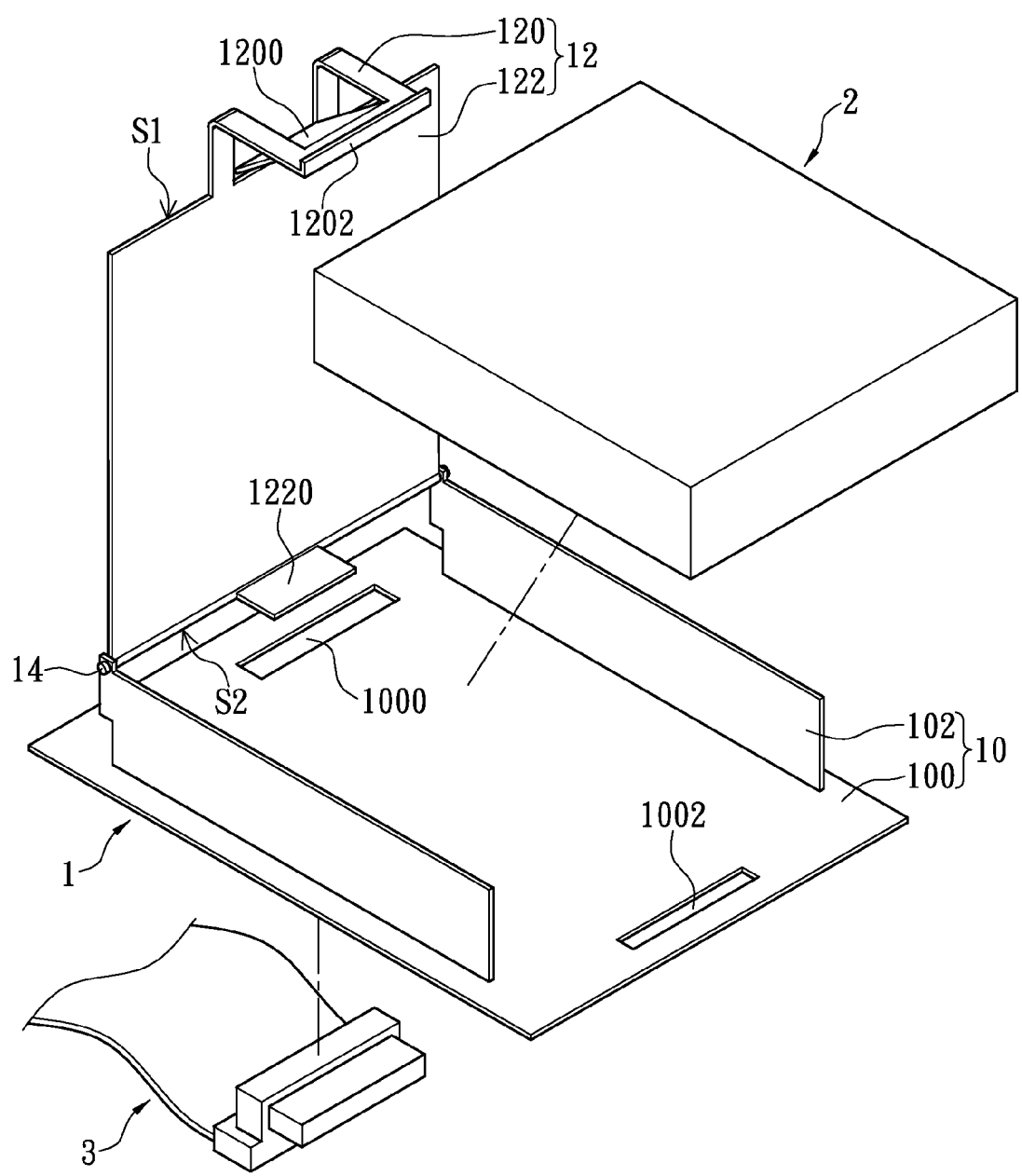
FIG. 1A is a three dimensional view of an external storage device enclosure according to an exemplary embodiment of the present disclosure.
Figure 1B:
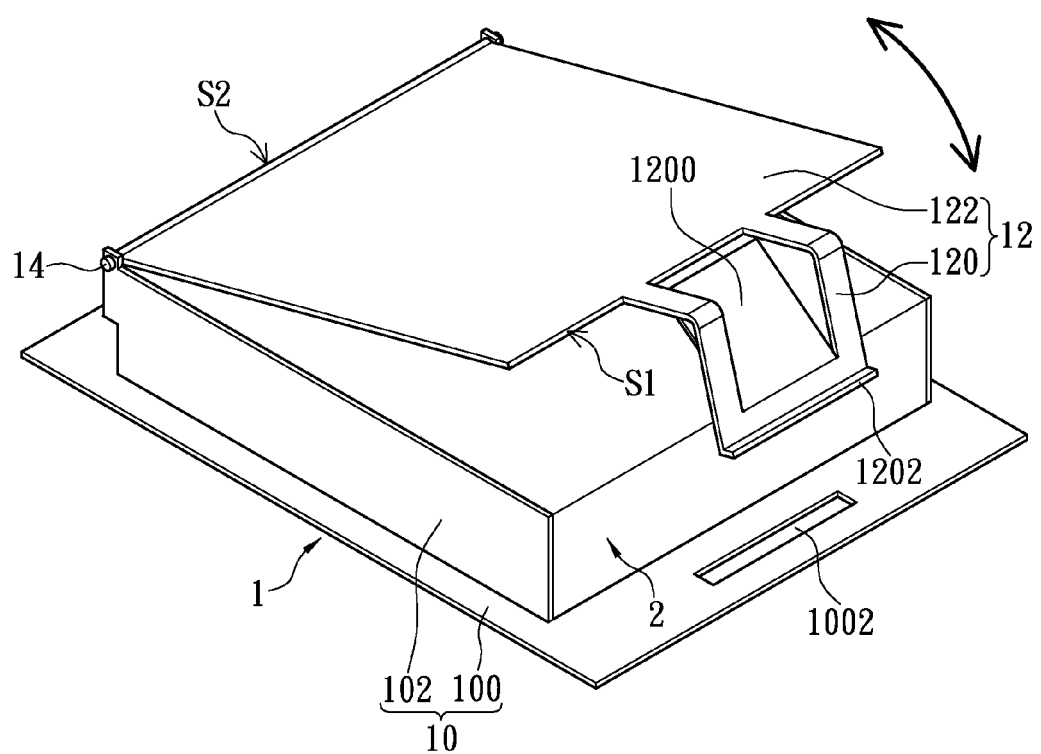
FIG. 1B is a three dimensional illustrating the external storage device enclosure of FIG. 1A under usage.

Referring to FIG. 1A and FIG. 1B, FIG. 1A is a three dimensional view of an external storage device enclosure according to an exemplary embodiment of the present disclosure, and FIG. 1B is a three dimensional illustrating the external storage device enclosure of FIG. 1A under usage. As shown in FIG. 1A and FIG. 1B, an external storage device enclosure 1 is use to accommodate a storage device 2, and the external storage device enclosure 1 comprises a box-body portion 10 and a cover-body portion 12.

In addition, the storage device described in the exemplary embodiment of the present disclosure a hard disk drive (HDD) or a solid state drive (SDD), and the present disclosure does not limit the size and the type of storage device which can be accommodated in the external storage device enclosure 1. For example, the size of the storage device 2 can be 1.5 inches, 2.5 inches, or 3.5 inches. In addition, the storage device 2 has at least one connection slot (not shown), the connection slot can be a data transfer interface for data access or a power interface for the operation of the storage device.

In general, the connection slot of the storage device 2 can be an integrated drive electronics (IDE) interface, a serial advanced technology attachment (SATA) interface, or a universal serial bus (USB) interface. The person with ordinary skill in the art further knows that the connection slot of storage device 2 can further be a small computer system interface (SCSI) or a serial attached SCSI (SAS) interface. In short, the present disclosure does not limit the specification of the connection slot of the storage device 2, and the specification of the connection port 3 is corresponding to the specification of the connection slot of the storage device 2.

The details of components in the external storage device enclosure 1 are illustrated as follows.

The box-body portion 10 supports a storage device 2, and the box-body portion 10 comprises a sole plate 100 and a side wall plate 102. The cover-body portion 12 is used to cover the box-body portion 10 and form a space to accommodate the storage device 2, and the cover-body portion 12 comprises a cover-board 120 and top-board 122.

The sole plate 100 includes has a slot 1002 located at the front side thereof, and the sole plate 100 has a via 1000. The slot 1002 is use to lock the cover-board 120. The connection port 3 can pass through the space of the via 1000. In other words, the connection port 3 can pass through the via 1000 to be installed on the sole plate 100. In general, the extending direction of the opening of the via 1000 is parallel to the extending direction of the opening of the slot 1002, but the present disclosure is not limited thereto. For example, the person with ordinary skill in the art can know that the slot 1002 can designed to be arc-shaped, and the arc-shaped slot 1002 does not affect the lock of the top-board 120. The connection port 3 is not limited to pass through the via 1000 to be installed on the sole plate 100, and the connection port 3 may be directly lock on the sole plate 100 by using a screw manner. The installation of the connection port 3 can be determined according to the practical design requirements, and the present disclosure is not limited thereto.

In addition, the present disclosure does not limit the location of the via 1000. For example, the via 1000 may be located at one side wall of the side wall plate 102. Of course, the person with ordinary skill in the art may not use the structure of the via 1000 according to the practical usage, and the present disclosure is not limited thereto.

The side wall plate 102 is located at two opposite sides of the sole plate 100, and used to clamp the storage device 2. In other words, the side wall plate 102 is used to fix the storage device 2, such that the storage device 2 is stably installed inside the external storage device enclosure 1. Practically, each of two inner-sides of the side wall plate 102 has at least one elastic material substrate to ensure that the storage device 2 can be firmly and stably clamped by the elastic material substrates of the side wall plate 102. Therefore, not only the problem that the storage device 2 installed inside the external storage enclosure 1 wavers due the space seam to is solved, but also the convenience for installing or detaching the storage device 2 is obtained.

Besides, the present disclosure does not limit the side length of the side wall plate 102. The person with ordinary skill in the art can design the side length of the side wall plate 102 according to the practical usage or structure. In addition, the present disclosure does not limit the connection of the side wall plate 102 and the sole plate 100. For example, the side wall plate 102 and the sole plate 100 can be a molded structure; or alternatively, the side wall plate 102 has a pad structure on its bottom, and the side wall plate 102 can be locked or soldered on the sole plate 100 through the pad structure.

The cover-board 120 has a driving element 1200 used to contact another side of the storage device 2 (hereinafter "the first-side of the storage device 2"), wherein the above another side of the storage device 2 is opposite to the side at which the connection slot is located. Practically, the driving element 1200 is a flexible and elastic substrate which bends inward itself, to form an oblique plane. Besides, the cover-board 120 further has a buckle 1202 at the edge thereof. The buckle 1202 can be get stuck by the slot 1002 of the sole plate 100, but the present disclosure does not limit the types of the buckle 1202 and the slot 1002.

Two sides of the top-board 122 are respectively the first-side S1 and the second-side S2 being opposite to the first-side S1, wherein the first side S1 of the top-board 122 connects the cover-board 120. The top-board 122 further has a rotation axis 14 located at the second side S2, and the top-board 122 is pivotally connected to the box-body portion 10 through the rotation axis 14. Generally speaking, the first side S1 is substantially parallel to the second side S2, but the present disclosure is not limited thereto. Furthermore, the side wall plate 102 has two bearing holes located at the left and right sides of the side wall plate 102, and the two bearing holes thus support the rotation axis 14. However, the person with ordinary skill in the art can design another proper structure according to the arbitrary opening and closing characteristics of the cover-body portion. The present disclosure does not limit whether the top-board 12 needs the rotation axis 14 to pivotally connect the box-body portion 10.

In addition, the top board 122 further has a releasing element 1220 located at the second side S2. The releasing element 1220 is used to contacts the side of the storage device 2 (hereinafter "the second-side of the storage device 2") at which the connection slot is located. Practically, the releasing element 1220 is generally a plane plate which is perpendicular to the top-board 122, but the present disclosure does not limit whether the angle between the top-board 122 and the releasing element is 90 degrees. The person with ordinary skill in the art can determine the angle between the top-board 122 and the releasing element 1220, and the type and length of the releasing element 1220 according to the practical usage condition. Besides, the present disclosure does not limit substrate types of the sole plate 100 and the side wall plate 102 in the external storage device enclosure. For example, the substrate can be made of plastic or alloy material.

Figure 2A:
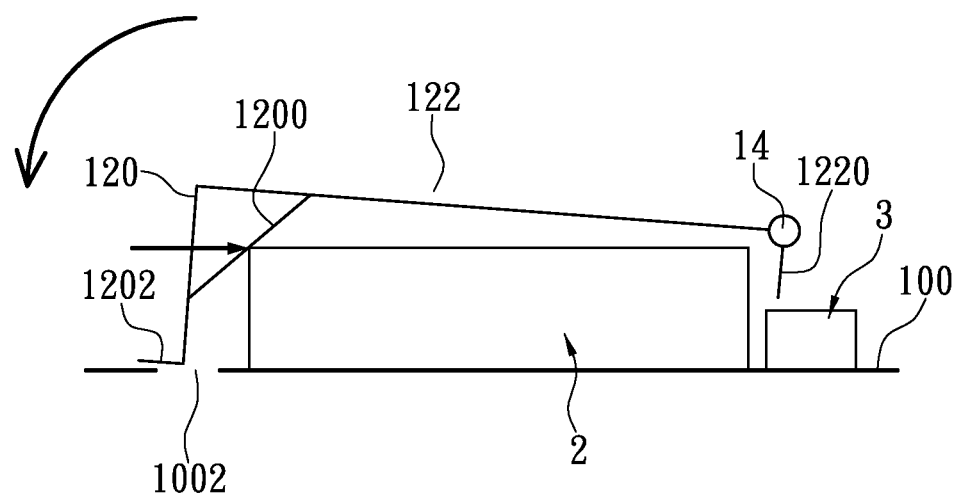
FIG. 2A is a transverse sectional view illustrating the external storage device enclosure of FIG. 1B when the storage device is being installed.
Figure 2B:
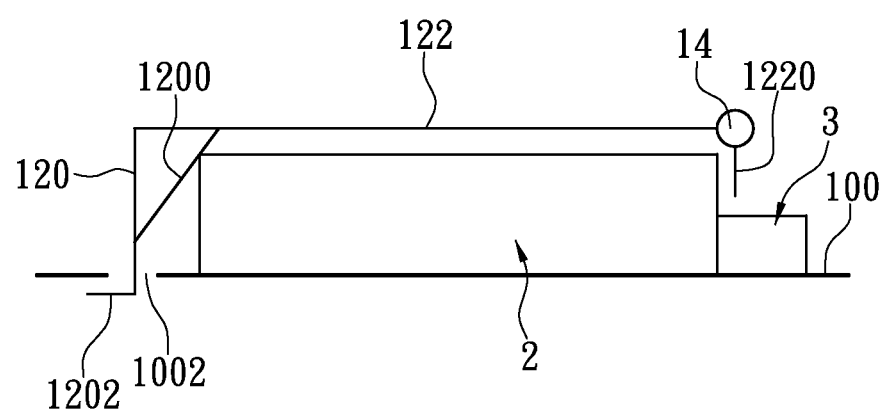
FIG. 2B is a transverse sectional view illustrating the external storage device enclosure of FIG. 1B after the top-board has been closed.

To clearly illustrate how the storage device 2 is installed to the connection port 3 by closing the cover-body portion 12, please refer to FIG. 2A and FIG. 2B, wherein FIG. 2A is a transverse sectional view illustrating the external storage device enclosure of FIG. 1B when the storage device is being installed, and FIG. 2B is a transverse sectional view illustrating the external storage device enclosure of FIG. 1B after the top-board has been closed.

As shown in FIG. 2A, when the storage device 2 is placed vertically into the accommodating room formed by the two side walls of the side wall plate 102 of the external storage device enclosure 1, and the cover-body portion 12 closes downward, the driving element 1200 of the cover-board 120 provides a longitudinal force to the storage device 2. Thus, the slot of the storage device 2 electrically connects the connection port 3 (as shown in FIG. 2B), and the buckle 1202 of the cover-board 120 is locked to the slot 1002 of the sole plate 100. In other words, when the cover-body portion 12 rotates around the rotation axis 14 and covers the storage device 2, the driving element 1200 contacts the first-side of storage device 2 to electrically connect the connection slot of the storage device 2 and the connection port 3. Accordingly, the external storage device enclosure 1 can automatic electrically connect the storage device 2 and connection port 3.

It is noted that, in the process for rotating the cover-body portion 12, when the cover board 120 starts to touch the edge between the first-side and top-side of the storage device 2, the distance from the connection slot of the storage device 2 to the connection port 3 is called the maximum driving distance. In other words, if the cover-board 120 starts to touch the top-side of the storage device 2, the driving element 1200 can not drive the slot of the storage device 2 to connect the connection port 3. Thus, if the user wants to use the driving element 1200 to drive the connection slot of the storage device 2 to connect the connection port 3, the position which the storage device 2 is placed inside the external storage device enclosure 1 will be limited.

Figure 3A:
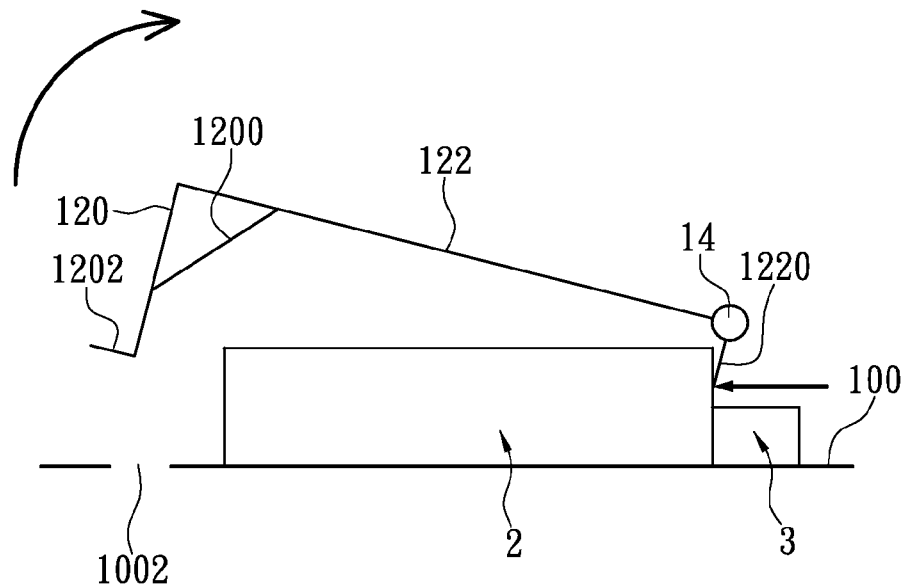
FIG. 3A is a transverse sectional view illustrating the external storage device enclosure of FIG. 1B when the storage device is being detached.
Figure 3B:
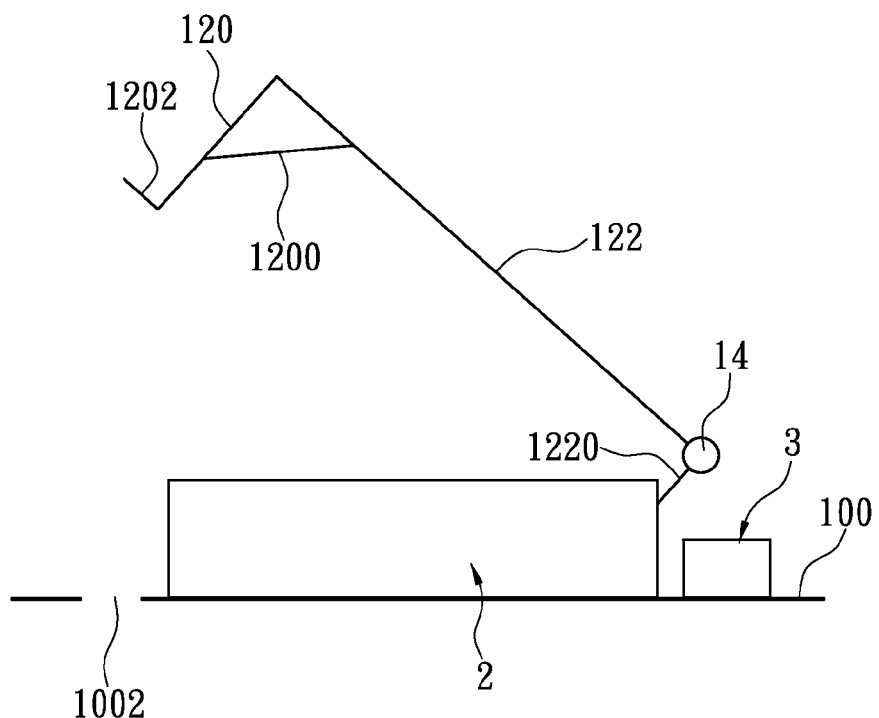
FIG. 3B is a transverse sectional view illustrating the external storage device enclosure of FIG. 3A when the storage device has been detached.

To clearly illustrate how the storage device 2 is detached from the connection port 3 by opening the cover-body portion 12, please refer to FIG. 3A and FIG. 3B, wherein FIG. 3A is a transverse sectional view illustrating the external storage device enclosure of FIG. 1B when the storage device is being detached, and FIG. 3B is a transverse sectional view illustrating the external storage device enclosure of FIG. 3A when the storage device has been detached.

As shown in FIG. 3A, when the connection slot of the storage device 2 has been connected to the connection port 3, and the cover-body portion 12 opens, the releasing element 1220 of the top-board 122 provided a longitudinal force to the storage device 2, and thus the connection slot of the storage device 2 is electrically separated from the connection port 3 (as shown in FIG. 3B). In other words, when the cover-body portion 12 rotates around the rotation axis 14 and exposes the storage device 2, the releasing element 1220 contacts the second-side of the storage device 2 to electrically separate the connection slot of the storage device 2 and the connection port 3.

Another Exemplary Embodiment of External Storage Device Enclosure

Figure 4A:
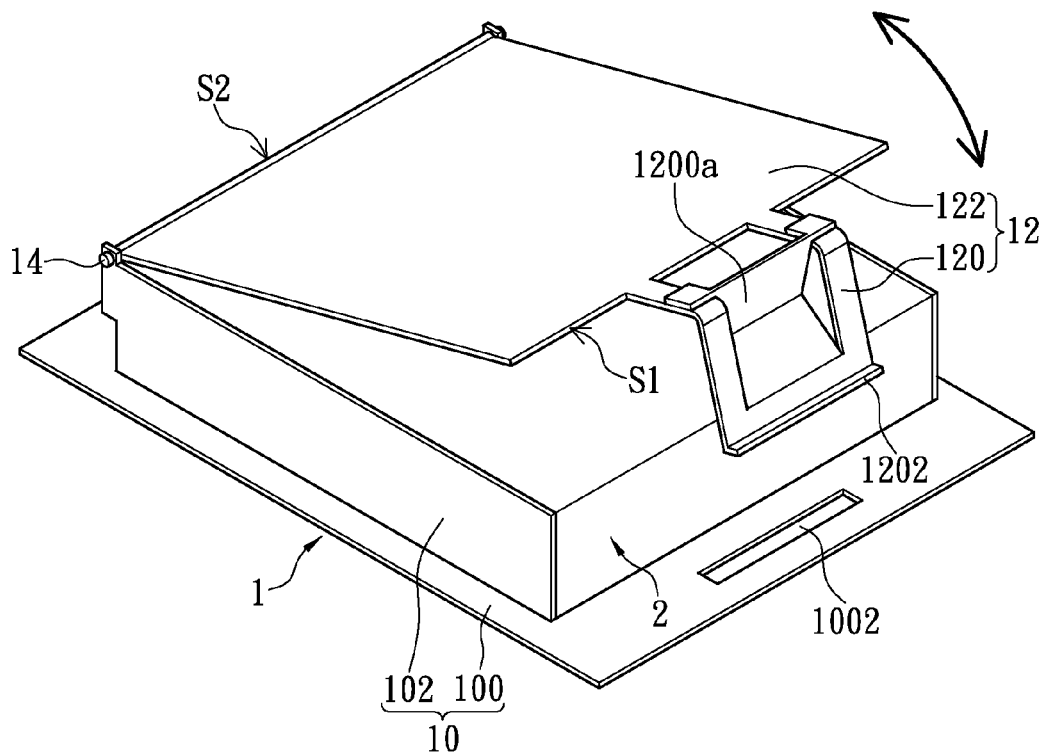
FIG. 4A is a three dimensional view of an external storage device enclosure with another driving element located at the different location under usage according to another exemplary embodiment of the present disclosure.
Figure 4B:
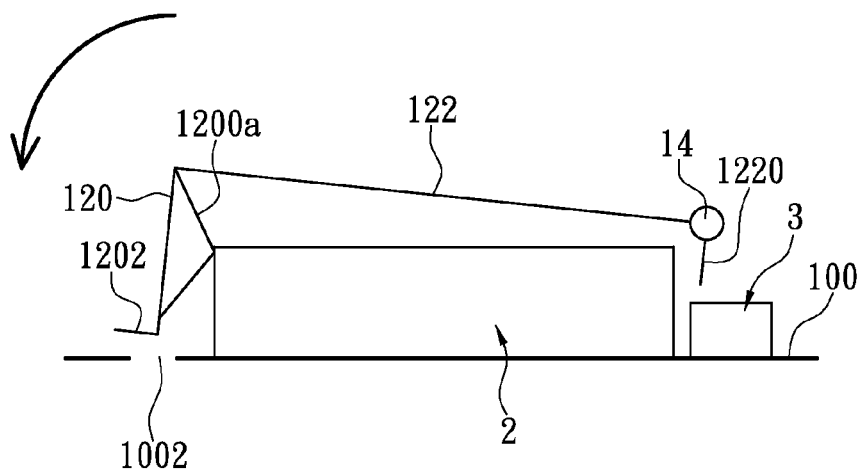
FIG. 4B is a transverse sectional view illustrating the external storage device enclosure of FIG. 4A when the storage device is being installed.

Noteworthy, the present disclosure does not limit the types and implementations of the driving element 1200. Referring to FIG. 4A and FIG. 4B, FIG. 4A is a three dimensional view of an external storage device enclosure with another driving element located at the different location under usage according to another exemplary embodiment of the present disclosure, and FIG. 4B is a transverse sectional view illustrating the external storage device enclosure of FIG. 4A when the storage device is being installed.

As shown in FIG. 4A, a driving element 1200a of the cover-board 120 is a convex structure, the convex structure can be a convex prism structure or a convex arc structure, but the present disclosure is not limited thereto. As shown in FIG. 4B, when the cover-body portion 12 rotates around the rotation axis 14 and covers the storage device, the convex structure of driving element 1200a contacts the first-side of storage device 2 to electrically connect the connection slot of the storage device 2 and the connection port 3.

Another Exemplary Embodiment of External Storage Device Enclosure

Figure 5A:
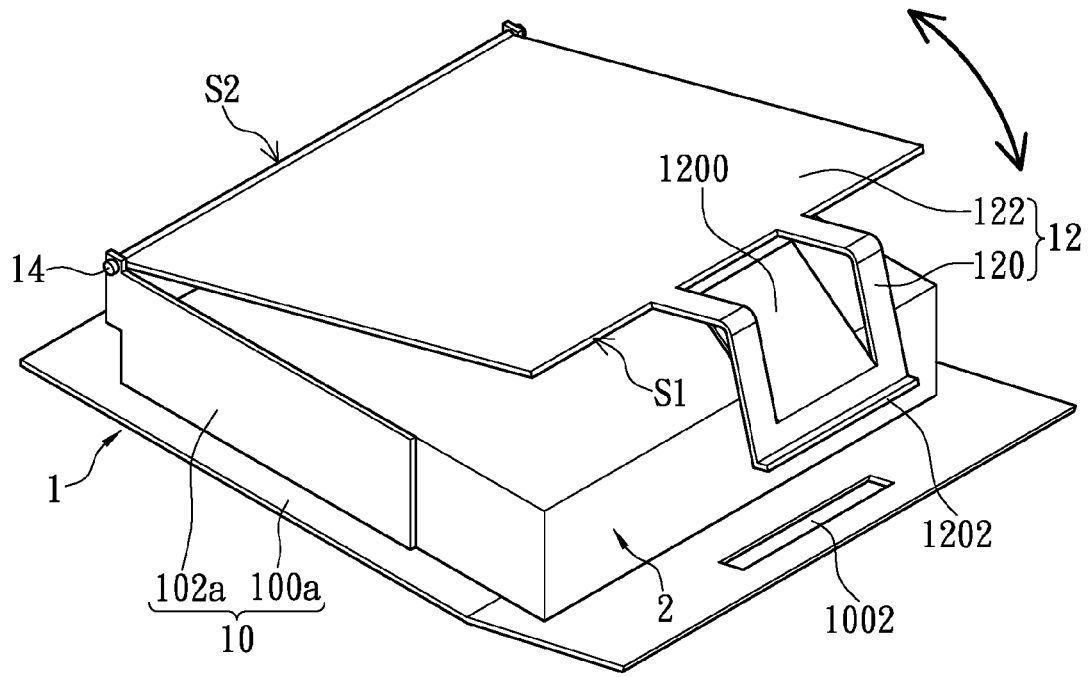
FIG. 5A is a three dimensional view of an external storage device enclosure with another sole plate under usage according to another exemplary embodiment of the present disclosure.
Figure 5B:
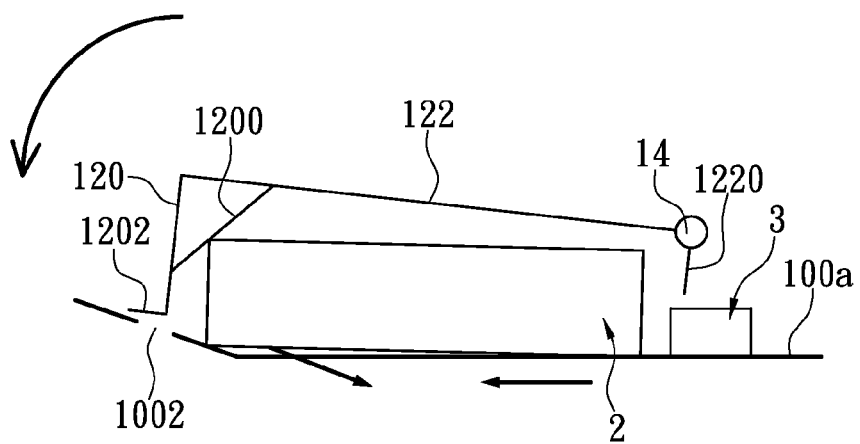
FIG. 5B is a transverse sectional view illustrating the external storage device enclosure of FIG. 5A when the storage device is being installed.

In addition, the region at which the slot 1002 of the sole plate 100 is located can be designed to an oblique plane, such that it is easier to connect the connection slot of the storage device 2 and the connection port 3. Referring to FIG. 5A and FIG. 5B, FIG. 5A is a three dimensional view of an external storage device enclosure with another sole plate under usage according to another exemplary embodiment of the present disclosure, and FIG. 5B is a transverse sectional view illustrating the external storage device enclosure of FIG. 5A when the storage device is being installed.

As shown in FIG. 5A, the sole plate 100a is designed to be a bent plate, such that the front-end plane of the sole plate 100a is slightly tilted. Accordingly, the front-end plane of the sole plate 100a can support the front-end of the storage device 2 to make the storage device 2 be placed on the sole plate 100 with a tilt angle. In other words, the sole plate 100a merely contacts the front-end and the rear-end of the storage device 2 to form a semi-triangular space gap. Therefore, as shown in FIG. 5B, when the cover-body portion 12 rotates around the rotation axis 14 and covers the storage device 2, the force which the storage device 2 contacts with the front-end plane of the sole plate 100a can cancel part of the friction force, and thus it is easier to use the driving element 1200 to drive the storage device 2 to the connection port 3. When the connection slot of the storage device 2 has been electrically connected to the connection port 3, the bottom surface of the storage device 2 merely contacts the rear-end plane of the sole plate 100a.

Another Exemplary Embodiment of External Storage Device Enclosure

Figure 6A:
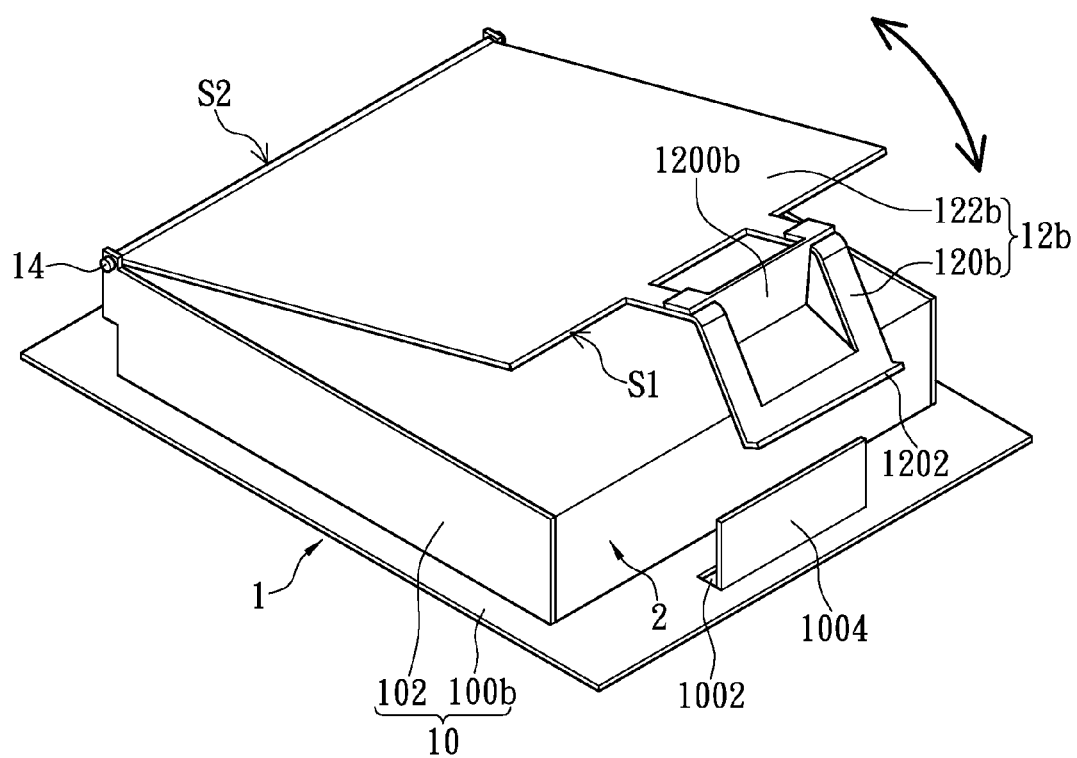
FIG. 6A is a three dimensional view of an external storage device enclosure with another sole plate under usage according to another exemplary embodiment of the present disclosure.
Figure 6B:
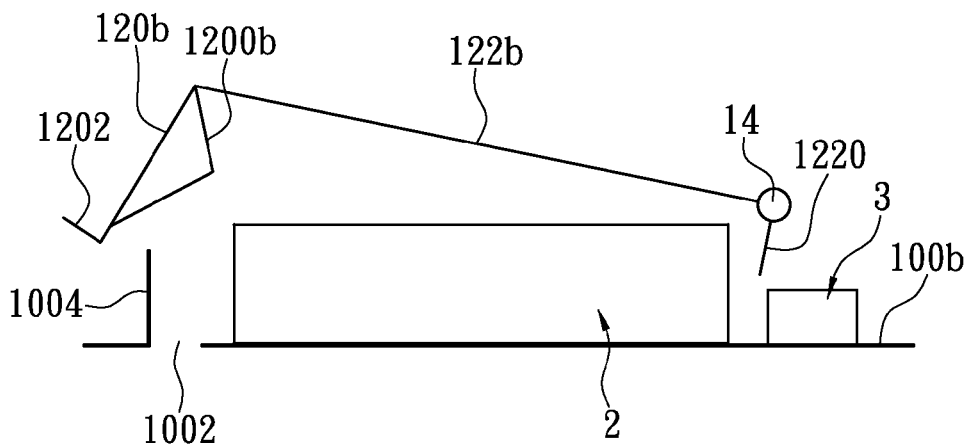
FIG. 6B is a transverse sectional view illustrating the external storage device enclosure of FIG. 6A.
Figure 6C:
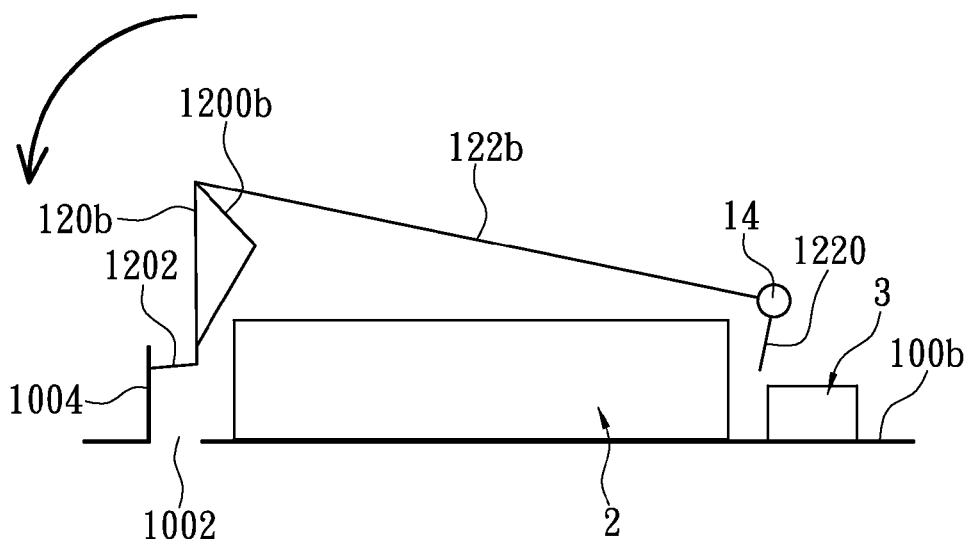
FIG. 6C is a transverse sectional view illustrating the external storage device enclosure of FIG. 6A when the storage device is being installed.

Referring to FIG. 6A, FIG. 6B, and FIG. 6C, FIG. 6A is a three dimensional view of an external storage device enclosure with another sole plate under usage according to another exemplary embodiment of the present disclosure, FIG. 6A is a three dimensional view of an external storage device enclosure with another sole plate under usage according to another exemplary embodiment of the present disclosure, and FIG. 6C is a transverse sectional view illustrating the external storage device enclosure of FIG. 6A when the storage device is being installed. As shown in FIG. 6A, the sole plate 100b further has a blocking element 1004, and the blocking element 1004 is installed on the outer-side of the slot 1002. In addition, the cover-board 120b and top-board 122b of the exemplary embodiment of the disclosure are flexible metal substrates, and an inner angel formed between the cover-board 120b and the top-board 122b is greater than 90 degrees, such as 120 degrees. Besides, the driving element 1200b of the cover-board 120b can be designed to be the above convex structure, but the present disclosure is not limited thereto.

Therefore, as shown in FIG. 6B and FIG. 6C, when the cover-body portion 12b is to be closed, and the buckle 1202 of the cover-board 120b is to be locked on the slot 1002 of the sole plate 100b, since the inner angle between the cover-board 120b and the top-board 122b is greater than 90 degrees, a force must be applied on the cover-board 120b to make the inner angle lees than 90 degrees, and then the cover-board 120b can cross the blocking element 1004.

When the cover-board 120b contacts the inner-side wall of the blocking element 1004, the driving element 1200b of the cover-board 120b contacts the storage device 2. When the buckle 1202 on the cover-board 120b is pushed downward into the slot 1002, the driving element 1200b continuously contacts the inner-side of the blocking element 1004, and thus the connection slot of the storage device 2 can electrically connect the connection port 3. In other words, when the cover-body portion 120b rotates around the rotation axis 14 and covers the storage device 2, an external force is applied to the driving element 1200b to contacts the inner-side of the blocking element 1004, and the buckle 1202 gets stuck in the slot 1002 along the blocking element 1004.

In addition, when the buckle 1202 has been locked in the slot 1202, the cover-board 120b slight rebounds, such that the buckle 1202 connects the slot 1002 more stably, and the storage device 2 is installed inside the external storage device enclosure 1 more stably. Since the person with ordinary skill in the art can easily deduce the above results according to FIG. 6B and FIG. 6C, the above detailed descriptions are not shown in drawings.

Another Exemplary Embodiment of External Storage Device Enclosure

Figure 7A:
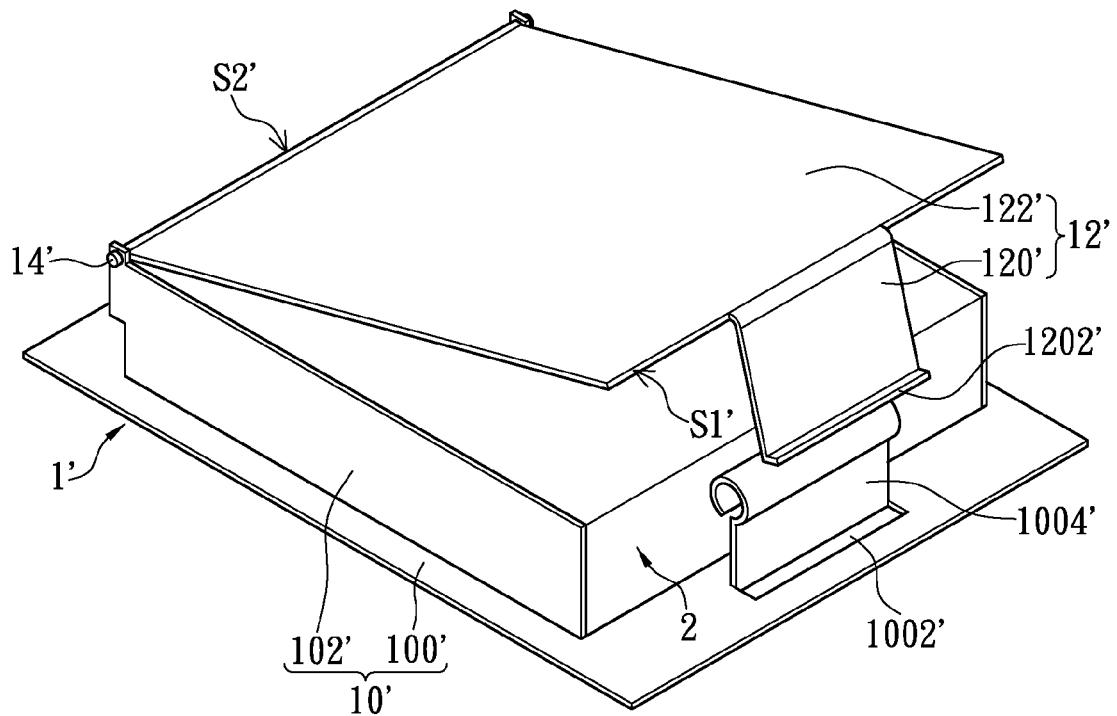
FIG. 7A is a three dimensional view of an external storage device enclosure under usage according to another exemplary embodiment of the present disclosure.
Figure 7B:
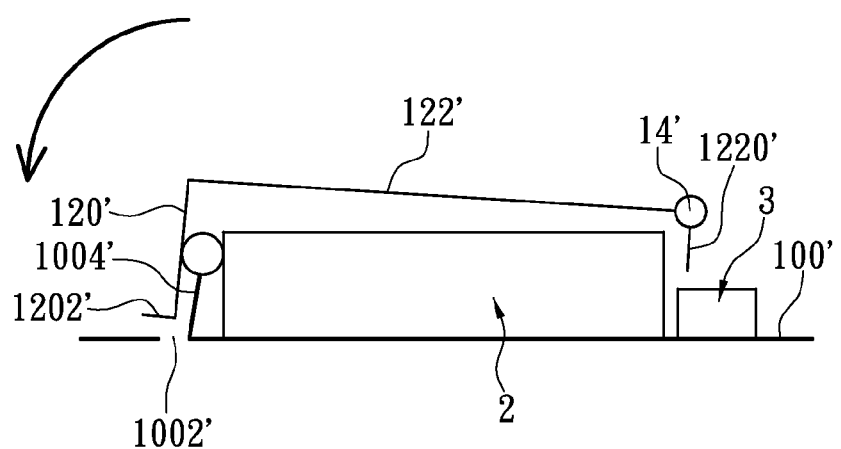
FIG. 7B is a transverse sectional view illustrating the external storage device enclosure of FIG. 7A when the storage device is being installed.

Please refer to FIG. 7A and FIG. 7B, FIG. 7A is a three dimensional view of an external storage device enclosure under usage according to another exemplary embodiment of the present disclosure. As shown in FIG. 7A, and FIG. 7B is a transverse sectional view illustrating the external storage device enclosure of FIG. 7A when the storage device is being installed. As shown in FIG. 7A, the box-body portion 10' of the external storage device enclosure 1' comprises the sole plate 100' and the side wall plate 102', and the cover-body portion 12' of the external storage device enclosure 1' comprises the cover-board 120' and top-board 122'. Since most components of the external storage device enclosure 1' in the exemplary embodiment are the same as the most components of the external storage device enclosure 1 in previous exemplary embodiment, functions and locations of the same components in the exemplary embodiment are omitted.

Compared to the external storage device enclosure 1 in the previous exemplary embodiment, the driving element 1004' of the external storage device enclosure 1' in the exemplary embodiment is located on the inner-side of the slot of the sole plate 100'. Thus, from FIG. 7A, it is obvious that the slot 1002' of the sole plate 100' is located on the outer-side of the driving element 1004', and the driving element 1004' and the via 1000' (not shown in FIG. 7A) are located on two opposite sides of the sole plate 100'.

Practically, the driving element 1004' of the present exemplary embodiment may be a flexible substrate, and one end of the driving element 1004' can be designed to be a convex structure, wherein the convex structure can be a convex prism structure or a convex sphere structure, but the present disclosure is not limited thereto. Generally, the extending direction of the driving element 1004' is perpendicular to the plane of the sole plate 100', but the present disclosure is not limited thereto. The person with ordinary skill in the art can design the proper structure according the actual mechanism.

In the view of the actual operation, as shown in FIG. 7B, when the storage device 2 is placed vertically into the accommodating room formed by the two side walls of the side wall plate 102' of the external storage device enclosure 1' and the driving element 1004', and the cover-body portion 12 closes downward, the cover-board 120' and the convex structure of the driving element 1004' being the flexible substrate contact each other, and the cover-board 120' provides a longitudinal force'. Thus, convex structure can drive the connection slot of the storage device 2 to connect the connection port 3, and then the buckle 1202' of the cover-board 120' is locked to the slot 1002' of the sole plate 1002'.

In other words, when the cover-body portion 12' rotates around the rotation axis 14' and covers the storage device 2, the cover-board 120' of the cover-body portion 12' contacts the outer-side of the driving element 1004', such that the inner-side of the driving element 1004' contacts the first-side of the storage device 2 to electrically connect the connection slot of the storage device 2 and the connection port 3.

Possible Result of Exemplary Embodiment

In summary, an exemplary embodiment of the disclosure provides an external storage device enclosure. With the design that both of the driving element and the releasing element are located on the cover-body portion, the external storage device electrically connects or separates the connection slot set of storage device and the connection port of the external storage device enclosure when the cover-body portion closes or opens. Accordingly, when the storage device is to be installed inside the external storage device enclosure, a problem that the connection slot of the storage device must be firstly electrically connected to the connection port is solved; and when the storage device is to be detached from the external storage device enclosure, a problem that the connection slot of the storage device must be firstly electrically separated from the connection port is also solved. Therefore, it is convenient for the user to install and detach the storage device. In addition, the external storage device enclosure of the present disclosure not only can be applied to the computing devices or servers of different kinds, but also can prevent the electromagnetic interference while the electromagnetic wave absorption material is attached on the external storage device enclosure. Thus, the external storage device enclosure is pragmatic.

The descriptions illustrated supra set forth simply the preferred exemplary embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:

1. An external storage device enclosure for accommodating a storage device, comprising:
   a box-body portion, supporting the storage device, the box-body portion having a sole plate, and a connection port installed on the sole plate; and
   a cover-body portion, comprising:
      a cover-board, having a driving element; and
      a top-board, having a first-side, a second-side, and a rotation axis located at the second-side of the top-board, wherein the first-side of the top-board connects the cover-board, and the top-board is pivotally connected to the box-body portion through the rotation axis;
   wherein the sole plate has a slot to lock the cover-board, and a blocking element, wherein the blocking element is located at an outer-side of the slot;
   wherein when the cover-body portion rotates around the rotation axis and covers the storage device, the driving element receives an external force by an inner-side of the blocking element, and the cover-board gets stuck in the slot along the blocking element; the driving element contacts a first-side of the storage device to electrically connect a connection slot of the storage device to the connection port.

2. The external storage device enclosure according to claim 1, wherein the box-body portion further has a via, and the connection port passes through the via to be installed on the box-body portion.

3. The external storage device enclosure according to claim 1, wherein the box-body portion further comprises:
   a side wall plate, located at two opposite sides of the sole plate, clamping the storage device.

4. The external storage device enclosure according to claim 1, wherein the cover-board and the top-board are flexible metal substrates, and an inner angle formed between the cover-board and the top-board is greater than 90 degrees.

5. The external storage device enclosure according to claim 1, wherein the top-board further has a releasing element located at the second-side of the top-board; when the cover-body portion rotates around the rotation axis and exposes the storage device, the releasing element contacts a second-side of the storage device to electrically separate the connection slot of the storage device from the connection port.

6. An external storage device enclosure for accommodating a storage device, comprising:
   a box-body portion, supporting the storage device, the box-body portion having a sole plate, a connection port installed on the sole plate, and a driving element; and
   a cover-body portion, comprising:
      a cover-board; and
      a top-board, having a first-side, a second-side, and a rotation axis located at the second-side of the top-board, wherein the first-side of the top-board connects the cover-board, and the top-board is pivotally connected to the box-body portion through the rotation axis;
   wherein the sole plate has a slot to lock the cover-board, and a blocking element, wherein the blocking element is located at an outer-side of the slot;
   wherein when the cover-body portion rotates around the rotation axis and covers the storage device, the driving element receives an external force by an inner-side of the blocking element, and the cover-board gets stuck in the slot along the blocking element; the top-board contacts an outer-side of the driving element, and thus an inner-side of the driving element contacts a first-side of the storage device to electrically connect a connection slot of the storage device to the connection port.

7. The external storage device enclosure according to claim 6, wherein the box-body portion further has a via, and the connection port passes through the via to be installed on the box-body portion.

8. The external storage device enclosure according to claim 6, wherein the box-body portion further comprises:
   a side wall plate, located at two opposite sides of the sole plate, clamping the storage device.

9. The external storage device enclosure according to claim 6, wherein the top-board further has a releasing element located at the second-side of the top-board; when the cover-body portion rotates around the rotation axis and exposes the storage device, the releasing element contacts a second-side of the storage device to electrically separate the connection slot of the storage device from the connection port.

10. An external storage device enclosure for accommodating a storage device, comprising:
    a box-body portion, having a sole plate for supporting the storage device, a connection port installed on the sole plate, and a driving element;
    wherein the sole plate has a slot, wherein the driving element is elastically protruded from the sole plate and is located between the slot and the storage device; and
    a cover-body portion, covered on the storage device, comprising:
       a cover-board, being selectively locked by the slot of the sole plate; and
       a top-board, having a first-side, a second-side, and a rotation axis located at the second-side of the top-board, wherein the first-side of the top-board connects the cover-board, and the top-board is pivotally connected to the box-body portion through the rotation axis;
    wherein when the cover-body portion rotates around the rotation axis and covers the storage device, the top-board contacts an outer-side of the driving element, and thus an inner-side of the driving element contacts a first-side of the storage device to electrically connect a connection slot of the storage device to the connection port.

11. The external storage device enclosure according to claim 10, wherein the box-body portion further has a via, and the connection port passes through the via to be installed on the box-body portion.

12. The external storage device enclosure according to claim 10, wherein the box-body portion further comprises a side wall plate, located at two opposite sides of the sole plate, clamping the storage device.

13. The external storage device enclosure according to claim 10, wherein the top-board further has a releasing element located at the second-side of the top-board; when the cover-body portion rotates around the rotation axis and exposes the storage device, the releasing element contacts a second-side of the storage device to electrically separate the connection slot of the storage device from the connection port.

\* \* \* \* \*